US010777621B2

(12) United States Patent
Lee et al.

(10) Patent No.: US 10,777,621 B2
(45) Date of Patent: Sep. 15, 2020

(54) DISPLAY DEVICE HAVING BLACK MATRIX

(71) Applicant: Samsung Display Co., Ltd., Yongin-Si, Gyeonggi-Do (KR)

(72) Inventors: Hyeonbum Lee, Hwaseong-si (KR); Jeongwon Kim, Seoul (KR); Hyoeng-ki Kim, Suwon-si (KR); Kwangwoo Park, Hwaseong-si (KR); Junhyuk Woo, Yongin-si (KR); Dongki Lee, Seongnam-si (KR); Eonjoo Lee, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/035,477

(22) Filed: Jul. 13, 2018

(65) Prior Publication Data

US 2019/0123112 A1 Apr. 25, 2019

(30) Foreign Application Priority Data

Oct. 24, 2017 (KR) .................. 10-2017-0138601

(51) Int. Cl.
| | |
|---|---|
| *H01L 27/32* | (2006.01) |
| *G06F 3/044* | (2006.01) |
| *H01L 51/00* | (2006.01) |
| *H01L 51/52* | (2006.01) |
| *G06F 3/041* | (2006.01) |

(52) U.S. Cl.
CPC .......... *H01L 27/323* (2013.01); *G06F 3/044* (2013.01); *G06F 3/0412* (2013.01); *G06F 3/0443* (2019.05); *G06F 3/0446* (2019.05); *H01L 27/3272* (2013.01); *H01L 51/0097* (2013.01); *H01L 51/5237* (2013.01); *H01L 51/5281* (2013.01); *H01L 51/5284* (2013.01); *G06F 2203/04111* (2013.01); *G06F 2203/04112* (2013.01); *H01L 27/3246* (2013.01); *H01L 2251/5338* (2013.01)

(58) Field of Classification Search
CPC ................. G06F 3/0412; G06F 3/044; G06F 2203/04111; G06F 2203/04112; G09G 3/30; G09G 3/32; G09G 3/3208; G09G 3/3225; G09G 3/3258; H01L 23/28; H01L 23/31; H01L 2227/32; H01L 2251/5338; H01L 27/1214; H01L 27/32; H01L 27/3211; H01L 27/3225; H01L 27/323;

(Continued)

(56) References Cited

U.S. PATENT DOCUMENTS

| | | | |
|---|---|---|---|
| 9,859,354 B2 | 1/2018 | Kang et al. | |
| 2009/0236976 A1* | 9/2009 | Lee ................. | H01L 51/5284 313/504 |

(Continued)

FOREIGN PATENT DOCUMENTS

| | | |
|---|---|---|
| KR | 10-2016-0081704 A | 7/2016 |
| KR | 10-2016-0130071 A | 11/2016 |

(Continued)

*Primary Examiner* — Keith L Crawley
(74) *Attorney, Agent, or Firm* — Innovation Counsel LLP

(57) ABSTRACT

A display device includes a pixel defining layer disposed on a substrate and defining a plurality of openings, a plurality of organic light emitting elements disposed in the openings, a first black matrix disposed on the pixel defining layer, a thin film encapsulation layer disposed on the organic light emitting elements and the first black matrix, a plurality of touch sensor portions disposed on the thin film encapsulation layer and overlapping with the pixel defining layer, a second black matrix disposed on the touch sensor portions, and a polarizing film disposed on the second black matrix.

20 Claims, 10 Drawing Sheets

(58) Field of Classification Search
CPC ............. H01L 27/3244; H01L 27/3246; H01L 27/3258; H01L 27/326; H01L 27/3272; H01L 27/3295; H01L 51/0097; H01L 51/5237; H01L 51/5281; H01L 51/5284
See application file for complete search history.

(56) References Cited

U.S. PATENT DOCUMENTS

| | | | |
|---|---|---|---|
| 2014/0145159 A1* | 5/2014 | Kim | H01L 27/322 257/40 |
| 2015/0049030 A1* | 2/2015 | Her | G06F 3/0412 345/173 |
| 2015/0187857 A1* | 7/2015 | Negishi | H01L 27/3272 257/40 |
| 2015/0301400 A1* | 10/2015 | Kimura | G02F 1/133512 349/43 |
| 2016/0322444 A1* | 11/2016 | Kang | H01L 27/3272 |
| 2017/0090634 A1* | 3/2017 | Yang | G06F 3/0412 |
| 2017/0199597 A1 | 7/2017 | Son et al. | |
| 2017/0199619 A1 | 7/2017 | Lee et al. | |
| 2019/0165074 A1* | 5/2019 | Lee | H01L 27/3272 |

FOREIGN PATENT DOCUMENTS

| | | |
|---|---|---|
| KR | 10-2017-0083668 A | 7/2017 |
| KR | 10-2017-0083670 A | 7/2017 |

\* cited by examiner

DISPLAY DEVICE HAVING BLACK MATRIX

CROSS-REFERENCE TO RELATED APPLICATION

This application claims priority to Korean Patent Application No. 10-2017-0138601, filed on Oct. 24, 2017, and all the benefits accruing therefrom under 35 U.S.C. § 119, the content of which in its entirety is herein incorporated by reference.

BACKGROUND

1. Field

Embodiments of the invention relate to a display device and, more particularly, to a display device capable of reducing a reflectance and of improving a sharpness of an image.

2. Description of the Related Art

Display devices for displaying images are included in electronic products for providing the images to users, such as smart phones, digital cameras, notebook computers, navigation systems, and smart televisions. The display device may include a display panel including a plurality of pixels for generating and displaying an image, and an input device (e.g., a keyboard, a mouse, or a touch panel).

The touch panel may be disposed on the display panel and may generate an input signal when a user touches the touch panel. The input signal generated from the touch panel may be provided to the display panel, and the display panel may provide an image corresponding to the input signal to a user in response to the input signal provided from the touch panel.

External light may be provided to the touch panel and the display panel. The external light provided to the touch and display panels may be reflected at internal elements of the touch panel and internal elements of the display panel, and the reflected light may exit from the display device. A sharpness of an image may be reduced by the external light reflected at the internal elements of the touch panel and the internal elements of the display panel.

SUMMARY

Embodiments of the invention may provide a display device capable of reducing a reflectance and of improving a sharpness of an image.

In an aspect of the invention, a display device may include a substrate, a pixel defining layer disposed on the substrate and defining a plurality of openings, a plurality of organic light emitting elements disposed in the openings, a first black matrix disposed on the pixel defining layer, a thin film encapsulation layer disposed on the organic light emitting elements and the first black matrix, a plurality of touch sensor portions which are disposed on the thin film encapsulation layer, which have mesh structures and which overlap with the pixel defining layer, a second black matrix disposed on the touch sensor portions, and a polarizing film disposed on the second black matrix.

In an embodiment, a width of the first black matrix may be greater than a width of the second black matrix.

In an embodiment, a width of the second black matrix may be greater than those of branch portions of the mesh structure of each of the touch sensor portions.

In an embodiment, a width of the first black matrix may be substantially equal to a width of the pixel defining layer.

In an embodiment, the display device may further include a first touch insulating layer disposed on the thin film encapsulation layer to cover the touch sensor portions, and a second touch insulating layer disposed on the first touch insulating layer. The second black matrix may be disposed on the first touch insulating layer, the second touch insulating layer may be disposed on the first touch insulating layer to cover the second black matrix, and the polarizing film may be disposed on the second touch insulating layer.

In an embodiment, the touch sensor portions may include a plurality of first touch sensor portions arranged in a first direction and disposed on the thin film encapsulation layer, a plurality of first connection portions disposed on the first touch insulating layer, a plurality of second touch sensor portions arranged in a second direction intersecting the first direction and disposed on the thin film encapsulation layer, and a plurality of second connection portions disposed on the thin film encapsulation layer. Each of the first connection portions may connect adjacent ones of the first touch sensor portions, and each of the second connection portions may connect adjacent ones of the second touch sensor portions. Each of the first connection portions may connect the first touch sensor portions adjacent to each other through contact holes formed in the first touch insulating layer.

In an embodiment, the second black matrix may be disposed on the first touch insulating layer to overlap with the first and second touch sensor portions and the first and second connection portions.

In an embodiment, the second black matrix may be disposed on the first touch insulating layer to cover the first connection portions.

In an embodiment, each of the first and second touch sensor portions may include a plurality of first branch portions extending in a first diagonal direction intersecting the first and second directions in a plane parallel to the first and second directions, and a plurality of second branch portions extending in a second diagonal direction intersecting the first diagonal direction in the plane to intersect the first branch portions. The second branch portions may be connected to the first branch portions.

In an embodiment, the pixel defining layer may extend in the first diagonal direction and the second diagonal direction, and the first and second branch portions may overlap with the pixel defining layer.

In an embodiment, the substrate may include a plurality of transistors connected to the organic light emitting elements. The organic light emitting elements may include a plurality of first electrodes disposed on the substrate, exposed by the openings, and connected to the transistors, a plurality of organic light emitting layers disposed on the first electrodes in the openings, and a second electrode disposed on the organic light emitting layers and the pixel defining layer.

In an embodiment, the first black matrix may be disposed on a portion of the second electrode at locations where the second electrode overlaps with the pixel defining layer.

In an aspect of the invention, a display device may include a substrate, a pixel defining layer disposed on the substrate and defining a plurality of openings, a plurality of organic light emitting elements disposed in the openings, a first black matrix disposed on the pixel defining layer, a thin film encapsulation layer disposed on the organic light emitting elements and the first black matrix, a plurality of touch sensor portions which are disposed on the thin film encapsulation layer, which have mesh structures and which overlap with the pixel defining layer, and a second black matrix disposed on the touch sensor portions. A width of the first black matrix may be greater than a width of the second black matrix, and the width of the second black matrix may be greater than those of branch portions of the mesh structure of each of the touch sensor portions.

In an aspect of the invention, a display device may include a display panel including a plurality of organic light emitting elements disposed in a plurality of pixel areas and a first black matrix disposed in a non-pixel area around each of the pixel areas, a touch sensing unit disposed on the display panel, and a polarizing film disposed on the touch sensing unit. The touch sensing unit may include a plurality of touch sensor portions overlapping with the first black matrix and having mesh structures, and a second black matrix disposed on the touch sensor portions. A width of the second black matrix may be greater than those of branch portions of the mesh structure of each of the touch sensor portions and may be less than a width of the first black matrix.

BRIEF DESCRIPTION OF THE DRAWINGS

The above and other aspects and features of the present invention will become more apparent by describing in further detail exemplary embodiments thereof with reference to the accompanying drawings, in which.

DETAILED DESCRIPTION OF THE EMBODIMENTS

Figure 1:
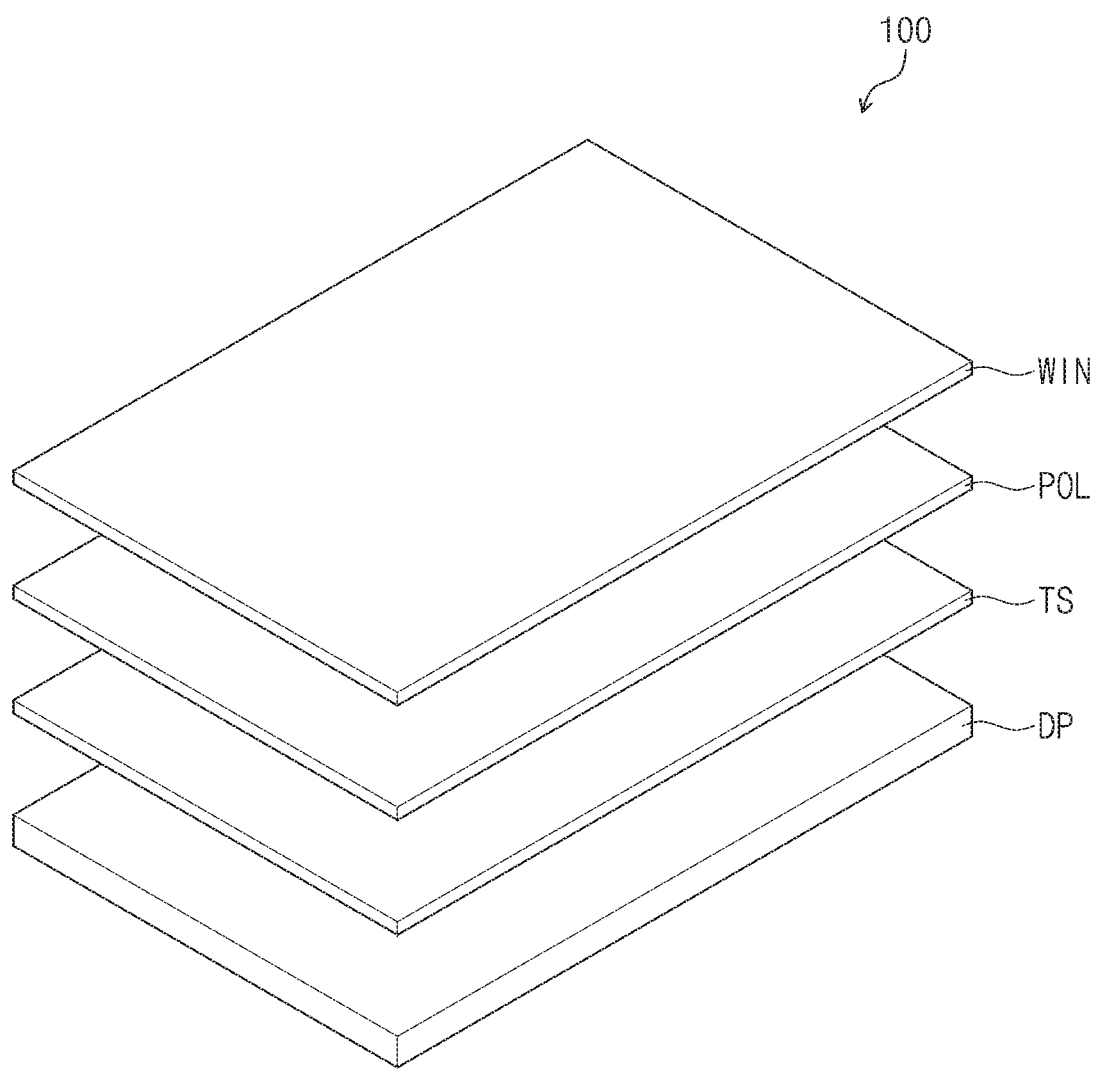
FIG. 1 is an exploded perspective view illustrating a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items. The terminology used herein is for the purpose of describing particular embodiments only and is not intended to be limiting. As used herein, the singular forms "a," "an," and "the" are intended to include the plural forms, including "at least one," unless the content clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Hereinafter, exemplary embodiments of the invention will be described in detail with reference to the accompanying drawings.

FIG. 1 is an exploded perspective view illustrating a display device according to an embodiment of the invention.

Referring to FIG. 1, a display device 100 according to an embodiment of the invention may include a display panel DP, a touch sensing unit TS disposed on the display panel DP, a polarizing film POL disposed on the touch sensing unit TS, and a window WIN disposed on the polarizing film POL.

The display panel DP, the touch sensing unit TS, the polarizing film POL and the window WIN may have flexibility. Each of the display panel DP, the touch sensing unit TS, the polarizing film POL and the window WIN may have a rectangular shape which has long sides parallel to a first direction DR1 and short sides parallel to a second direction DR2 intersecting the first direction DR1.

The display panel DP may generate an image and may provide the generated image to a user. The display panel DP may be a liquid crystal display panel, an organic light emitting display panel, an electrophoretic display panel, an electrowetting display panel, or one of other various display panels capable of displaying images. For example, the display panel DP may be the organic light emitting display panel.

The touch sensing unit TS may sense an external input (e.g., a hand or finger of a user or a touch pen) to convert the external input into an input signal and may provide the input signal to the display panel DP. The touch sensing unit TS may sense the external input by a capacitive method. The display panel DP may receive the input signal from the touch sensing unit TS and may generate an image corresponding to the input signal.

The image generated from the display panel DP may pass through the touch sensing unit TS and may be polarized through the polarizing film POL. Thereafter, the image may pass through the window WIN and then may be provided to a user. The window WIN may define a top surface of the display device 100 and may protect the display panel DP, the touch sensing unit TS, and the polarizing film POL from external force or impact.

Figure 2:
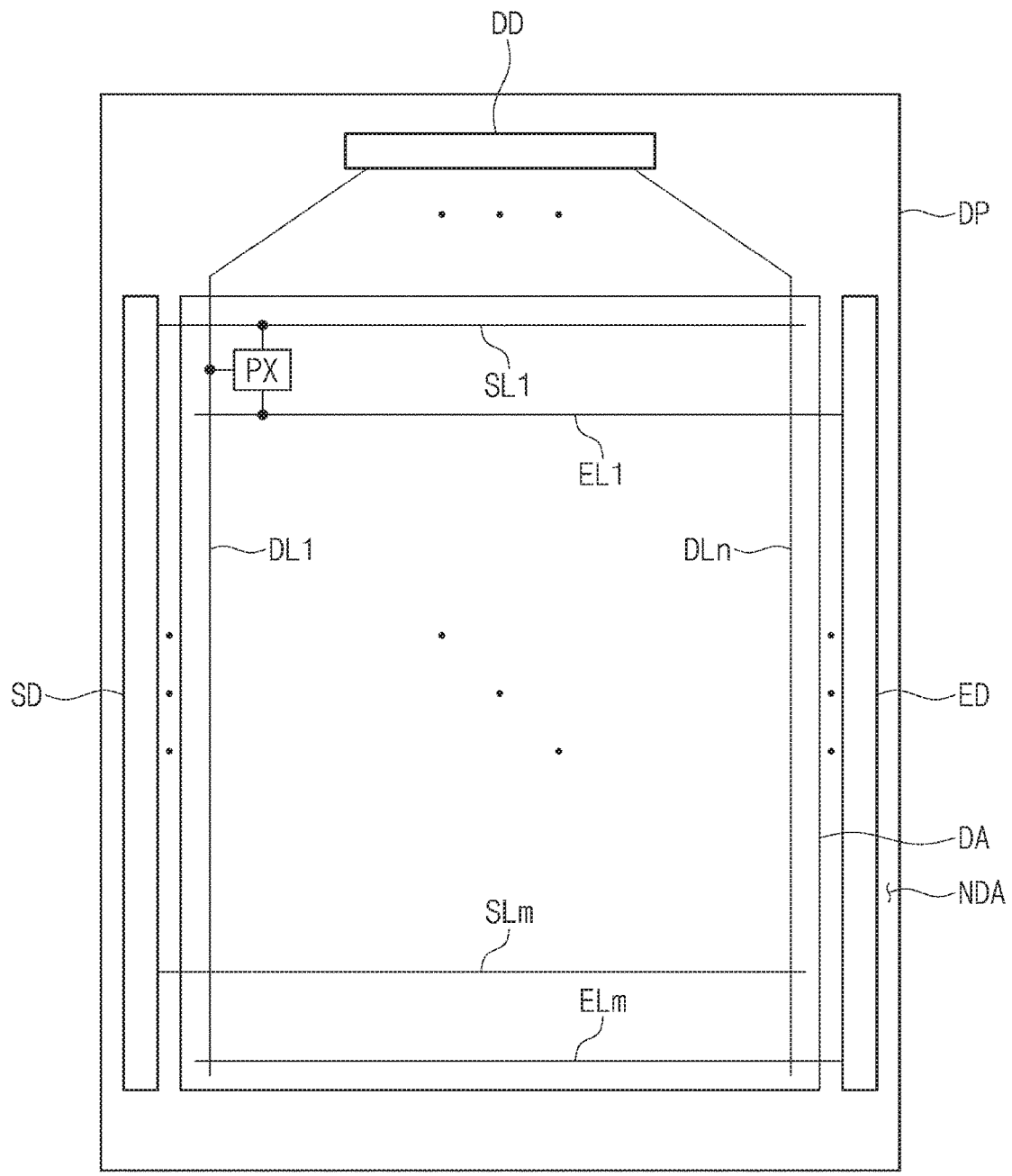
FIG. 2 is a plan view illustrating a display panel of FIG. 1.
Figure 2:
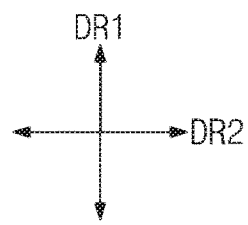

FIG. 2 is a plan view illustrating a display panel of FIG. 1.

Referring to FIG. 2, the display panel DP may include a scan driver SD, a data driver DD, an emission driver ED, a plurality of pixels PX, a plurality of scan lines SL1 to SLm, a plurality of data lines DL1 to DLn, and a plurality of emission lines EL1 to Elm. Here, 'm' and 'n' are natural numbers.

One pixel PX is illustrated in FIG. 2 for the purpose of ease and convenience in illustration. However, the plurality of pixels PX arranged in a matrix form may be disposed in the display panel DP. The pixels PX may be connected to the scan lines SL1 to SLm, the data lines DL1 to DLn, and the emission lines EL1 to ELm.

The scan driver SD, the data driver DD and the emission driver ED may be defined as a driver for driving the pixels PX. The scan driver SD, the data driver DD and the emission driver ED may provide driving signals for driving the pixels PX to the pixels PX, and the pixels PX may generate an image in response to the driving signals.

The display panel DP may have a flat surface (or a plane) parallel to the first and second directions DR1 and DR2, and the flat surface of the display panel DP may include a display area DA and a non-display area NDA surrounding the display area DA. The display area DA may display an image but the non-display area NDA may not display an image.

The pixels PX may be disposed in the display area DA, and the scan driver SD, the data driver DD and the emission driver ED may be disposed in the non-display area NDA. The scan driver SD may be disposed in the non-display area NDA adjacent to one of the long sides of the display panel DP. The emission driver ED may be disposed in the non-display area NDA adjacent to the other of the long sides of the display panel DP. The data driver DD may be manufactured in the form of an integrated circuit chip and may be disposed in the non-display area NDA adjacent to one of the short sides of the display panel DP.

The scan lines SL1 to SLm may extend in the second direction DR2 and may be connected to the scan driver SD. The scan lines SL1 to SLm may receive scan signals from the scan driver SD. The data lines DL1 to DLn may extend in the first direction DR1 and may be connected to the data driver DD. The data lines DL1 to DLn may receive data voltages from the data driver DD. The emission lines EL1 to ELm may extend in the second direction DR2 and may be connected to the emission driver ED. The emission lines EL1 to ELm may receive emission signals from the emission driver ED.

The scan driver SD may generate a plurality of the scan signals, and the scan signals may be applied to the pixels PX through the scan lines SL1 to SLm. The scan signals may be applied sequentially to the pixels PX. The data driver DD may generate a plurality of the data voltages, and the data voltages may be applied to the pixels PX through the data lines DL1 to DLn. The emission driver ED may generate a plurality of the emission signals, and the emission signals may be applied to the pixels PX through the emission lines EL1 to ELm.

Even though not shown in the drawings, the display device 100 may include a timing controller for controlling operations of the scan driver SD, the data driver DD and the emission driver ED. The timing controller may generate a scan control signal, a data control signal, and an emission control signal in response to control signals received from signal sources outside of the display panel. In addition, the timing controller may receive image signals from the outside signal sources and may convert a data format of the image signals to allow the converted data format of the image signals to match with interface specifications with the data driver DD. The timing controller may provide the image signals, the data format of which is converted, to the data driver DD.

The scan driver SD may generate the scan signals in response to the scan control signal, and the emission driver ED may generate the emission signals in response to the emission control signal. The data driver DD may receive the image signals, the data format of which is converted, and may generate the data voltages corresponding to the image signals in response to the data control signal.

The pixels PX may receive the data voltages in response to the scan signals. The pixels PX may emit light of brightness corresponding to the data voltages in response to the emission signals, thereby displaying an image. Emission times of the pixels PX may be controlled by the emission signals.

Figure 3:
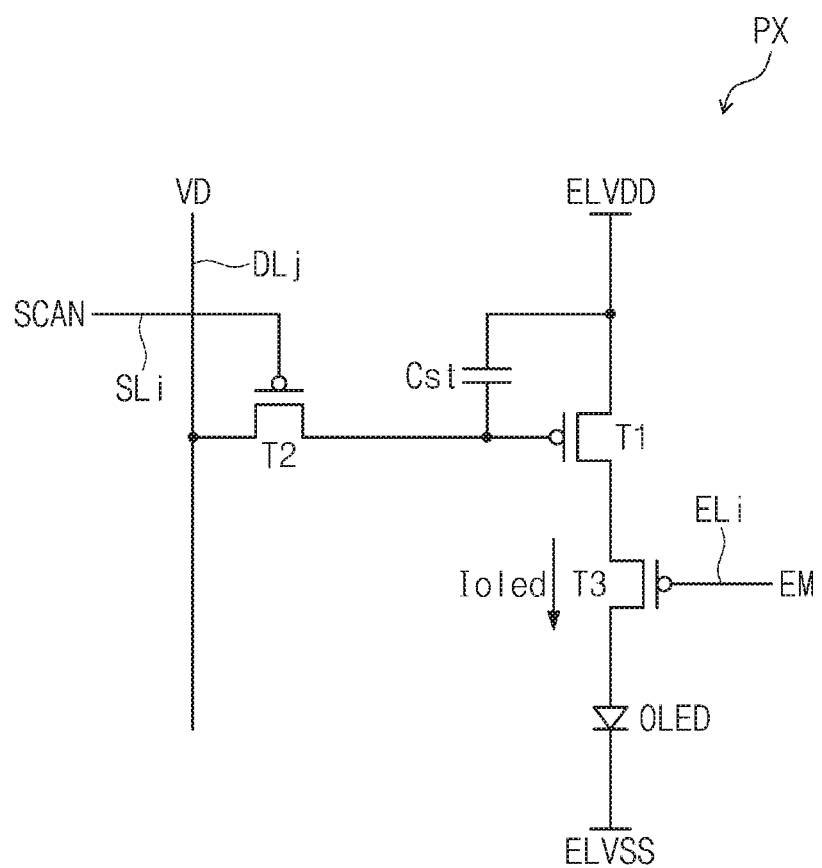
FIG. 3 is an equivalent circuit diagram of a pixel illustrated in FIG. 2.

FIG. 3 is an equivalent circuit diagram of a pixel illustrated in FIG. 2.

One pixel PX is illustrated in FIG. 3. However, the other pixels PX disposed in the display panel DP may have the same structure or configuration as the pixel PX illustrated in FIG. 3.

Referring to FIG. 3, the pixel PX may be connected to a corresponding scan line SLi of the scan lines SL1 to SLm, a corresponding data line DLj of the data lines DL1 to DLn, and a corresponding emission line ELi of the emission lines EL1 to ELm. Here, 'i' is a natural number equal to or less than 'm', and 'j' is a natural number equal to or less than 'n'.

The pixel PX may include an organic light emitting element OLED, a driving transistor T1, a capacitive element Cst, a switching transistor T2, and an emission control transistor T3. The organic light emitting element OLED may be an organic light emitting diode.

A source terminal of the driving transistor T1 may be provided with a first voltage ELVDD, and a drain terminal of the driving transistor T1 may be connected to a source terminal of the emission control transistor T3. A gate terminal of the driving transistor T1 may be connected to a drain terminal of the switching transistor T2.

A gate terminal of the switching transistor T2 may be connected to the scan line SLi, and a source terminal of the switching transistor T2 may be connected to the data line DLj. A first electrode of the capacitive element Cst may be connected to the source terminal of the driving transistor T1, and a second electrode of the capacitive element Cst may be connected to the gate terminal of the driving transistor T1.

A gate terminal of the emission control transistor T3 may be connected to the emission line ELi, and a drain terminal of the emission control transistor T3 may be connected to an anode of the organic light emitting element OLED. A cathode of the organic light emitting element OLED may receive a second voltage ELVSS. A voltage level of the second voltage ELVSS may be lower than a voltage level of the first voltage ELVDD.

The switching transistor T2 may be turned-on in response to a scan signal SCAN provided through the scan line SLi. The turned-on switching transistor T2 may provide a data voltage VD received through the data line DLj to the gate terminal of the driving transistor T1. The capacitive element Cst may store the data voltage VD applied to the gate terminal of the driving transistor T1 and may retain the stored data voltage VD after the switching transistor T2 is turned-off.

The gate terminal of the emission control transistor T3 may receive an emission signal EM through the emission line ELi, and thus the emission control transistor T3 may be turned-on. The turned-on emission control transistor T3 may provide a current Ioled flowing through the driving transistor T1 to the organic light emitting element OLED. The pixel PX may emit light while the emission signal EM is applied to the emission control transistor T3. An intensity of the light emitted from the organic light emitting element OLED may be changed depending on the amount of the current Ioled.

For example, the transistors T1 to T3 of the pixel PX are PMOS transistors. However, embodiments of the invention are not limited thereto. In another embodiment, the transistors T1 to T3 of the pixel PX may be NMOS transistors.

Figure 4:
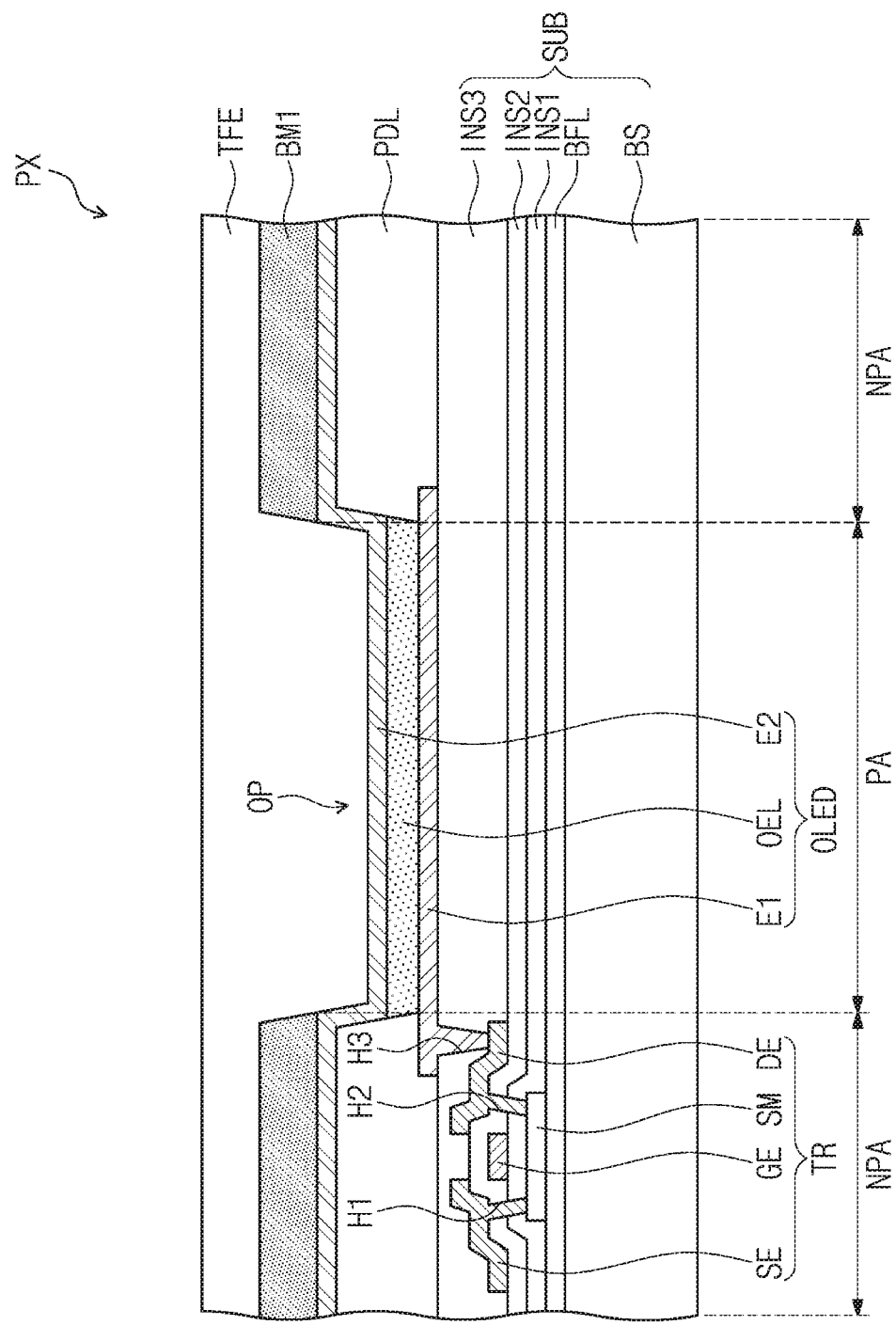
FIG. 4 is a cross-sectional view illustrating the pixel of FIG. 3.

FIG. 4 is a cross-sectional view illustrating the pixel of FIG. 3.

Referring to FIG. 4, the pixel PX may include an organic light emitting element OLED disposed on a substrate SUB and a transistor TR connected to the organic light emitting element OLED. The transistor TR may be the emission control transistor T3 of FIG. 3. The substrate SUB may include a base substrate BS and the transistor TR disposed on the base substrate BS. The base substrate BS may be a transparent flexible substrate. For example, the base substrate BS may be formed of polyimide (PI).

A buffer layer BFL may be disposed on the base substrate BS. The buffer layer BFL may be an inorganic insulating layer including an inorganic material. A semiconductor layer SM of the transistor TR may be disposed on the buffer layer BFL. The semiconductor layer SM may include an inorganic semiconductor such as amorphous silicon or poly-silicon or may include an organic semiconductor. Alternatively, the semiconductor layer SM may include an oxide semiconductor. Even though not shown in FIG. 4, the semiconductor layer SM may include a source region, a drain region, and a channel region between the source region and the drain region.

A first insulating layer INS1 may be disposed on the buffer layer BFL to cover the semiconductor layer SM. A gate electrode GE of the transistor TR may be disposed on the first insulating layer INS1 and may overlap with the semiconductor layer SM. The gate electrode GE may be disposed to overlap with the channel region of the semiconductor layer SM. A second insulating layer INS2 may be disposed on the first insulating layer INS1 to cover the gate electrode GE. The second insulating layer INK may be defined as an interlayer insulating layer. Each of the first and second insulating layers INS1 and INS2 may be an inorganic insulating layer including an inorganic material.

A source electrode SE and a drain electrode DE of the transistor TR may be spaced apart from each other on the second insulating layer INK. The source electrode SE may be connected to the source region of the semiconductor layer SM through a first contact hole H1 formed in the first and second insulating layers INS1 and INS2. The drain electrode DE may be connected to the drain region of the semiconductor layer SM through a second contact hole H2 formed in the first and second insulating layers INS1 and INS2.

A third insulating layer INS3 may be disposed on the second insulating layer INS2 to cover the source electrode SE and the drain electrode DE of the transistor TR. The third insulating layer INS3 may be defined as a planarization layer providing a flat top surface. The third insulating layer INS3 may be an organic insulating layer including an organic material.

A first electrode E1 of the organic light emitting element OLED may be disposed on the third insulating layer INS3. The first electrode E1 may be connected to the drain electrode DE of the transistor TR through a third contact hole H3 formed in the third insulating layer INS3. The first electrode E1 may be defined as a pixel electrode or an anode. The first electrode E1 may include a transparent electrode or a reflective electrode.

A pixel defining layer PDL exposing a predetermined portion of the first electrode E1 may be disposed on the first electrode E1 and the third insulating layer INS3. An opening OP exposing the predetermined portion of the first electrode E1 may be defined in the pixel defining layer PDL. An area in which the opening OP is disposed may be defined as a pixel area PA. A peripheral area of the pixel area PA may be defined as a non-pixel area NPA.

An organic light emitting layer OEL may be disposed on the first electrode E1 in the opening OP. The organic light emitting layer OEL may include an organic material capable of generating light having one of a red color, a green color and a blue color. In other words, the organic light emitting layer OEL may generate one of red light, green light and blue light. However, embodiments of the invention are not limited thereto. In other embodiments, the organic light emitting layer OEL may generate white light by a combination of organic materials generating red light, green light and blue light.

The organic light emitting layer OEL may include a low-molecular organic material or a high-molecular organic material. Even though not shown in the drawings, the organic light emitting layer OEL may be formed of a multi-layer that includes a hole injection layer (HIL), a hole transporting layer (HTL), a light emitting layer, an electron transporting layer (ETL), and an electron injection layer (EIL). The hole injection layer may be disposed on the first electrode E1. The hole transporting layer, the light emitting layer, the electron transporting layer and the electron injection layer may be sequentially stacked on the hole injection layer.

A second electrode E2 of the organic light emitting element OLED may be disposed on the pixel defining layer PDL and the organic light emitting layer OEL. The second electrode E2 may be defined as a common electrode or a cathode. The second electrode E2 may include a transparent electrode or a reflective electrode. When the display panel DP is a front emission type organic light emitting display panel, the first electrode E1 may be the reflective electrode and the second electrode E2 may be the transparent electrode. When the display panel DP is a back emission type organic light emitting display panel, the first electrode E1 may be the transparent electrode and the second electrode E2 may be the reflective electrode.

A first black matrix BM1 for blocking light may be disposed on the pixel defining layer PDL. In more detail, the first black matrix BM1 may be disposed on a portion of the second electrode E2, which overlaps with the pixel defining layer PDL. The first black matrix BM1 may be disposed in the non-pixel area NPA and may have a width which is substantially equal to that of the pixel defining layer PDL. However, embodiments of the invention are not limited thereto. In another embodiment, the width of the first black matrix BM1 may be less than the width of the pixel defining layer PDL.

The organic light emitting element OLED may be formed in the pixel area PA and may include the first electrode E1, the organic light emitting layer OEL, and the second electrode E2 in the pixel area PA. A thin film encapsulation layer TFE may be disposed on the organic light emitting element OLED and the first black matrix BM1.

The first electrode E1 may be an anode corresponding to a hole injection electrode, and the second electrode E2 may be a cathode corresponding to an electron injection electrode. To emit light from the organic light emitting layer OEL by the transistor TR, the first voltage ELVDD may be applied to the first electrode E1 and the second voltage ELVSS may be applied to the second electrode E2. At this time, a polarity of the second voltage ELVSS may be opposite to that of the first voltage ELVDD.

Holes and electrons injected in the organic light emitting layer OEL may be combined with each other to generate excitons, and the excitons may transition from an excited state to a ground state to emit light from the organic light emitting element OLED. The organic light emitting element OLED may emit the red light, the green light, the blue light, or the white light on the basis of a flow of the current to display a piece of image information.

Figure 5:
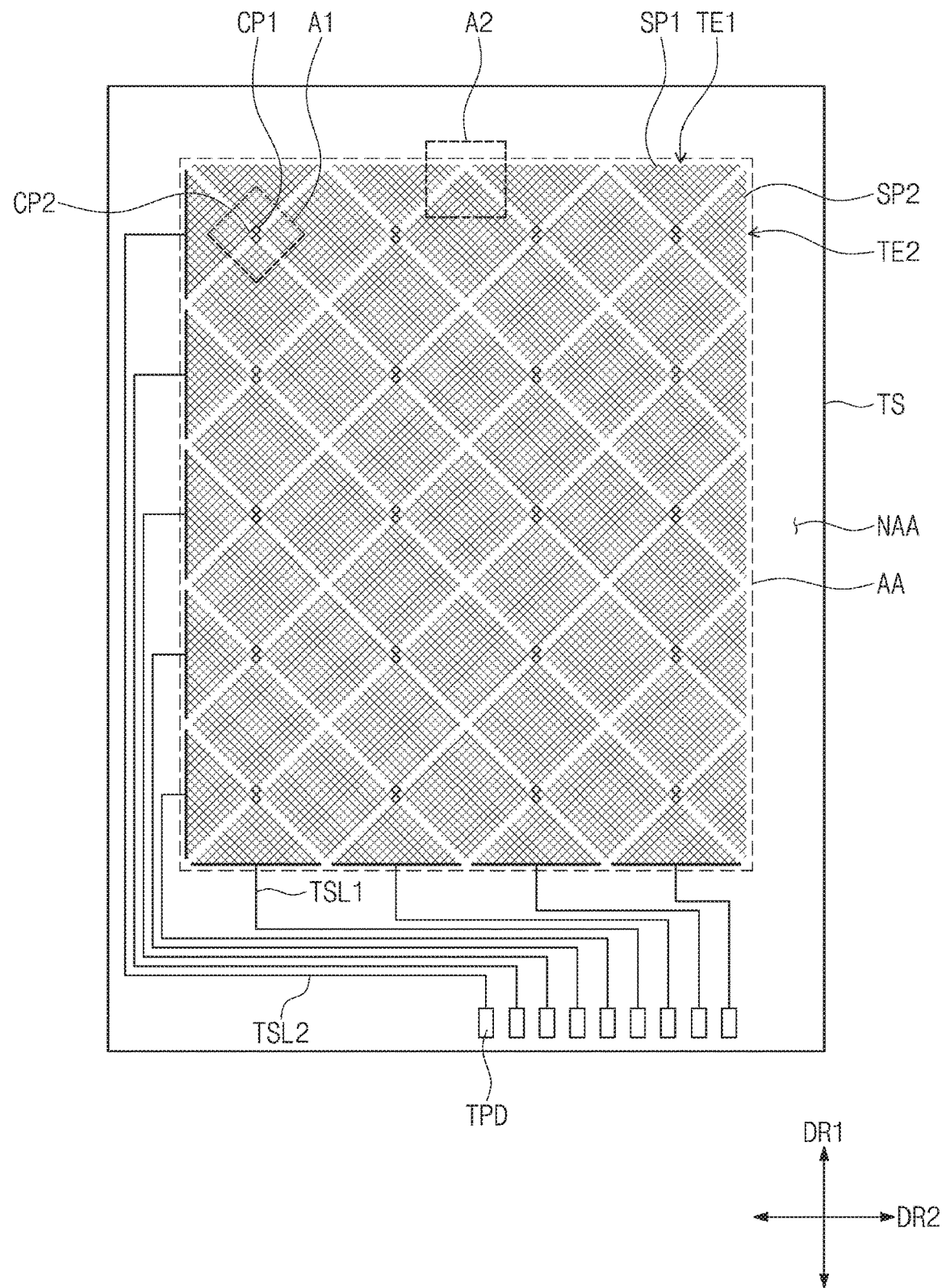
FIG. 5 is a plan view illustrating a touch sensing unit of FIG. 1.
Figure 6:
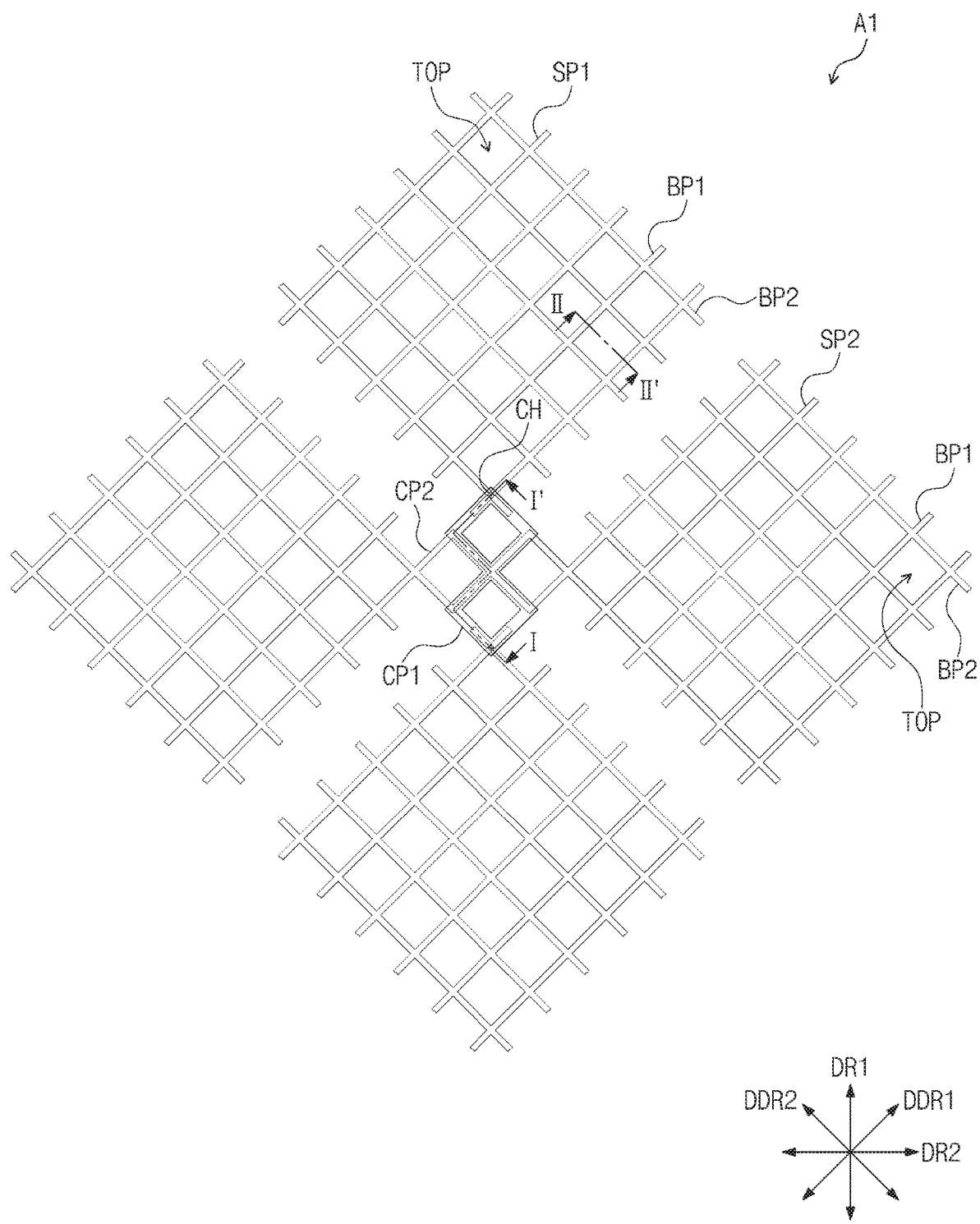
FIG. 6 is an enlarged view of a first area A1 illustrated in FIG. 5.

FIG. 5 is a plan view illustrating a touch sensing unit of FIG. 1. FIG. 6 is an enlarged view of a first area A1 illustrated in FIG. 5.

Referring to FIGS. 5 and 6, the touch sensing unit TS may include a plurality of first touch electrodes TE1, a plurality of first touch signal lines TSL1 connected to the first touch electrodes TE1, a plurality of second touch electrodes TE2, a plurality of second touch signal lines TSL2 connected to the second touch electrodes TE2, and a plurality of touch pad portions TPD connected to the first and second touch signal lines TSL1 and TSL2.

The touch sensing unit TS may include an active area AA and a non-active area NAA surrounding the active area AA when viewed in a plan view. The first touch electrodes TE1 and the second touch electrodes TE2 may be disposed in the active area AA, and the first and second touch signal lines TSL1 and TSL2 and the touch pad portions TPD may be disposed in the non-active area NAA. The active area AA may overlap with the display area DA.

Each of the first touch electrodes TE1 may have a mesh shape in which touch openings TOP are defined. The first touch electrodes TE1 may extend in the first direction DR1 and may be arranged in the second direction DR2. The second touch electrodes TE2 may intersect the first touch electrodes TE1 and may be insulated from the first touch electrodes TE1. Each of the second touch electrodes TE2 may have a mesh shape in which touch openings TOP are defined. The second touch electrodes TE2 may extend in the second direction DR2 and may be arranged in the first direction DR1.

The first and second touch electrodes TE1 and TE2 may include a plurality of touch sensor portions SP1 and SP2. In more detail, each of the first touch electrodes TE1 may include a plurality of first touch sensor portions SP1 and a plurality of first connection portions CP1 for connecting the first touch sensor portions SP1. The first touch sensor portions SP1 may be arranged in the first direction DR1, and each of the first connection portions CP1 may connect adjacent two of the first touch sensor portions SP1.

Each of the second touch electrodes TE2 may include a plurality of second touch sensor portions SP2 and a plurality of second connection portions CP2 for connecting the second touch sensor portions SP2. The second touch sensor portions SP2 may be arranged in the second direction DR2, and each of the second connection portions CP2 may connect adjacent two of the second touch sensor portions SP2.

As illustrated in FIG. 6, each of the first and second touch sensor portions SP1 and SP2 may include a plurality of branch portions BP1 and BP2. The touch openings TOP may be defined by the branch portions BP1 and BP2, and thus the first and second touch sensor portions SP1 and SP2 may have mesh structures.

The branch portions BP1 and BP2 may include a plurality of first branch portions BP1, and a plurality of second branch portions BP2 intersecting the first branch portions BP1 and connected to the first branch portions BP1. The first branch portions BP1 may extend in a first diagonal direction DDR1 intersecting the first and second directions DR1 and DR2 in a plane parallel to the first and second directions DR1 and DR2. The second branch portions BP2 may extend in a second diagonal direction DDR2 intersecting the first diagonal direction DDR1 in the plane parallel to the first and second directions DR1 and DR2. The first and second branch portions BP1 and BP2 of each of the first and second touch sensor portions SP1 and SP2 may be formed as a single unitary body.

The first connection portions CP1 may be insulated from the second connection portions CP2 and may be disposed on a layer different from a layer on which the second connection portions CP2 are disposed. The first and second touch sensor portions SP1 and SP2 and the second connection portions CP2 may be disposed on the same layer. The second touch sensor portions SP2 and the second connection portions CP2 may be formed as a single unitary body. Each of the first connection portions CP1 may be connected to the first touch sensor portions SP1 adjacent to each other through contact holes CH defined in an insulating layer. Even though not shown in the drawings, the first and second touch signal lines TSL1 and TSL2 may also have mesh shapes.

The first touch sensor portions SP1 and the second touch sensor portions SP2 may not overlap with each other and may be alternately arranged, and capacitors may be formed between the first touch electrodes TE1 and the second touch electrodes TE2 (e.g., between the first touch sensor portions SP1 and the second touch sensor portions SP2). When a hand (e.g., a finger) of a user or a touch pen touches the touch sensing unit TS, a capacitance of the capacitor formed by the first and second touch electrodes TE1 and TE2 may be changed.

The change in capacitance of the capacitor at a touch position may be transmitted to a driving circuit (not shown) through the first and second touch signal lines TSL1 and TSL2 and the touch pad portions TPD. The change in capacitance of the capacitor may be converted into an electrical signal by X and Y input processing circuits (not shown) of the driving circuit, thereby determining or verifying the touch position.

Figure 7:
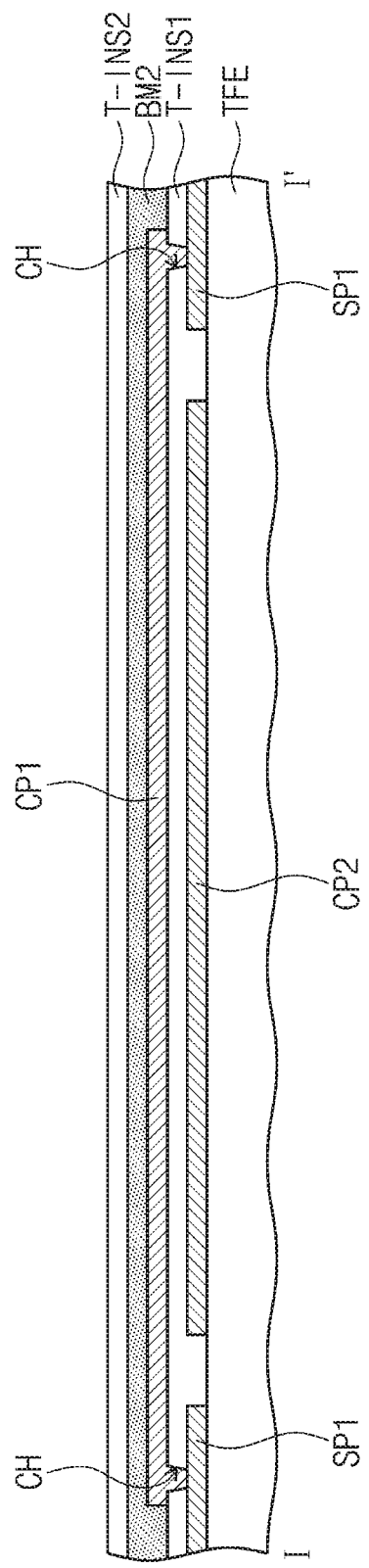
FIG. 7 is a cross-sectional view taken along a line I-I' of FIG. 6.
Figure 8:
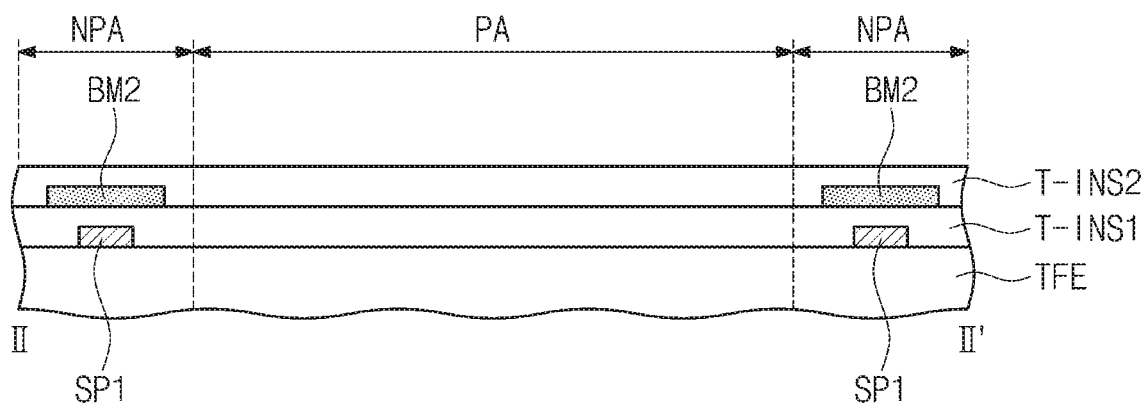
FIG. 8 is a cross-sectional view taken along a line II-II' of FIG. 6.

FIG. 7 is a cross-sectional view taken along a line I-I' of FIG. 6. FIG. 8 is a cross-sectional view taken along a line II-II' of FIG. 6.

Referring to FIGS. 7 and 8, the first touch sensor portions SP1 and the second connection portions CP2 may be disposed on the thin film encapsulation layer TFE. Even though not shown in FIGS. 7 and 8, the second touch sensor portions SP2 formed with the second connection portions CP2 as the single unitary body may also be disposed on the thin film encapsulation layer TFE.

A first touch insulating layer T-INS1 may be disposed on the thin film encapsulation layer TFE to cover the first and second touch sensor portions SP1 and SP2 and the second connection portions CP2. A second black matrix BM2 may be disposed on the first touch insulating layer T-INS1. The second black matrix BM2 may be disposed on the first and second touch sensor portions SP1 and SP2 and the first and second connection portions CP1 and CP2.

The first connection portion CP1 may be disposed on the first touch insulating layer T-INS1 and may be connected to the first touch sensor portions SP1 adjacent to each other through the contact holes CH defined in the first touch insulating layer T-INS1. The second black matrix BM2 may be disposed on the first touch insulating layer T-INS1 to overlap with the first and second touch sensor portions SP1 and SP2 and the first and second connection portions CP1 and CP2. The second black matrix BM2 may be disposed on the first touch insulating layer T-INS1 to cover the first connection portion CP1. The second black matrix BM2 may have a width that is greater than those of the branch portions BP1 and BP2 of the mesh structure of each of the first and second touch sensor portions SP1 and SP2.

A second touch insulating layer T-INS2 may be disposed on the first touch insulating layer T-INS1 to cover the second black matrix BM2. Each of the first and second touch insulating layers T-INS1 and T-INS2 may be an insulating layer including an inorganic material or an organic material.

Figure 9:
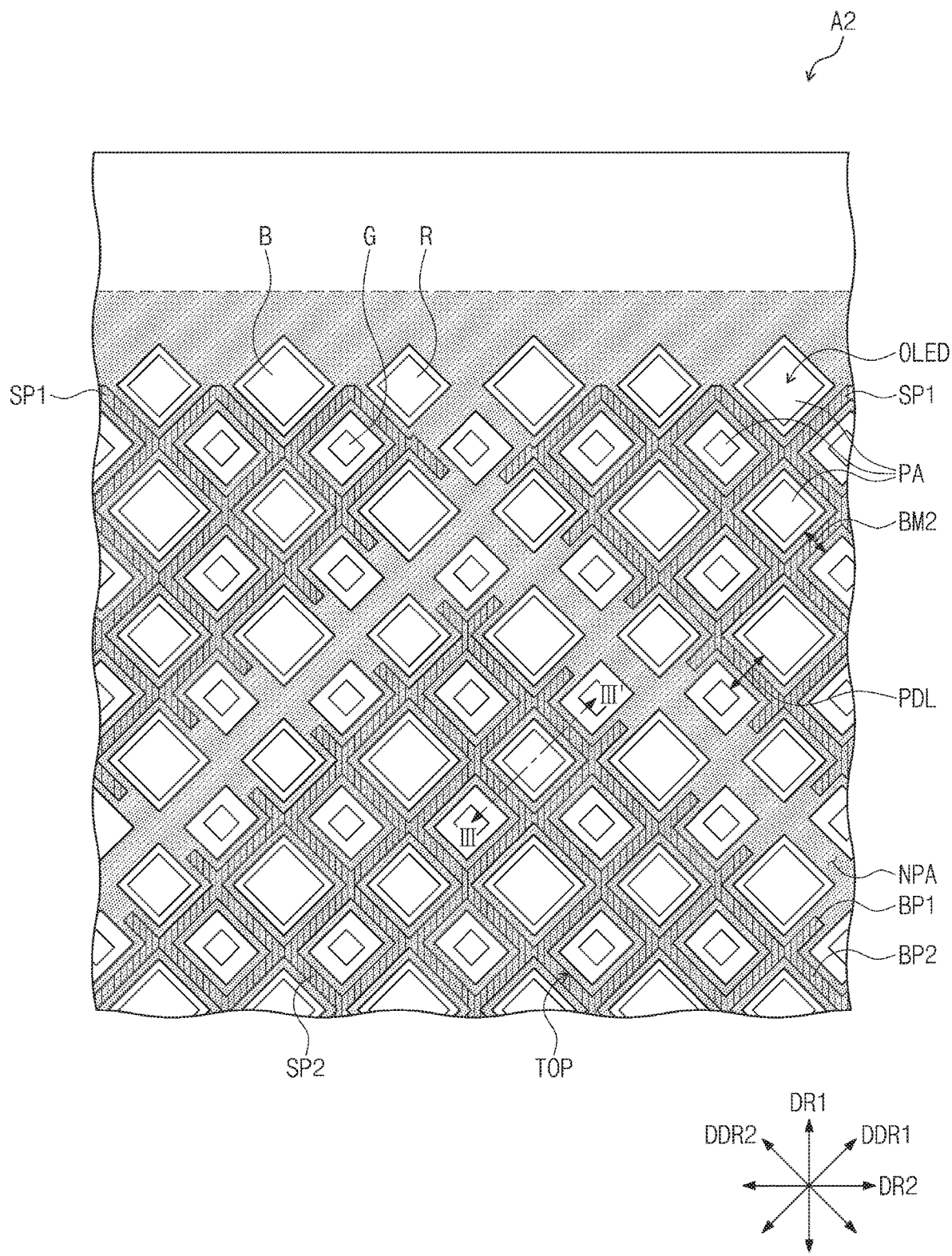
FIG. 9 is an enlarged view of a second area A2 of FIG. 5 to illustrate components of a touch sensing unit and a display panel in the second area A2.

FIG. 9 is an enlarged view of a second area A2 of FIG. 5 to illustrate components of a touch sensing unit and a display panel in the second area A2.

FIG. 9 illustrates planar structures of the pixels PX and the first and second touch sensor portions SP1 and SP2 according to an embodiment of the invention.

Referring to FIG. 9, the pixels PX may include pixel areas PA and a non-pixel area NPA around each of the pixel areas PA. Each of the pixel areas PA may be the pixel area PA illustrated in FIG. 4, and the non-pixel area NPA may be the non-pixel area illustrated in FIG. 4. Each of the pixel areas PA may display a red color, a green color, a blue color, or a white color.

The pixel areas PA may have different sizes depending on the colors displayed thereby. For example, a size of a pixel area B displaying the blue color may be greater than a size of a pixel area R displaying the red color, and the size of the pixel area R displaying the red color may be greater than a size of a pixel area G displaying the green color.

The pixel areas PA may have diamond shapes and may be arranged in the first diagonal direction DDR1 and the second diagonal direction DDR2. For example, four pixel areas G displaying the green color may be disposed around each of the pixel areas B displaying the blue color in the first and second diagonal directions DDR1 and DDR2. Four pixel areas G displaying the green color may be disposed around each of the pixel areas R displaying the red color in the first and second diagonal directions DDR1 and DDR2.

The pixel defining layer PDL disposed in the non-pixel area NPA may extend in the first diagonal direction DDR1 and the second diagonal direction DDR2. Thus, the organic light emitting elements OLED disposed in the pixel areas PA may have diamond shapes. The first and second branch portions BP1 and BP2 may overlap with the pixel defining layer PDL.

The first and second touch sensor portions SP1 and SP2 may overlap with the non-pixel area NPA to have the mesh structures. The touch openings TOP of the first and second touch sensor portions SP1 and SP2 may have diamond shapes corresponding to the shapes of the pixel areas PA and may have sizes corresponding to the sizes of the pixel areas PA.

The pixel areas PA may overlap with the touch openings TOP, and the sizes of the pixel areas PA may be smaller than the sizes of the touch openings TOP. The second black matrix BM2 may be disposed on the first and second touch sensor portions SP1 and SP2. The width of the second black matrix BM2 may be greater than those of the branch portions BP1 and BP2 of the first and second touch sensor portions SP1 and SP2 and may be less than that of the pixel defining layer PDL.

Figure 10:
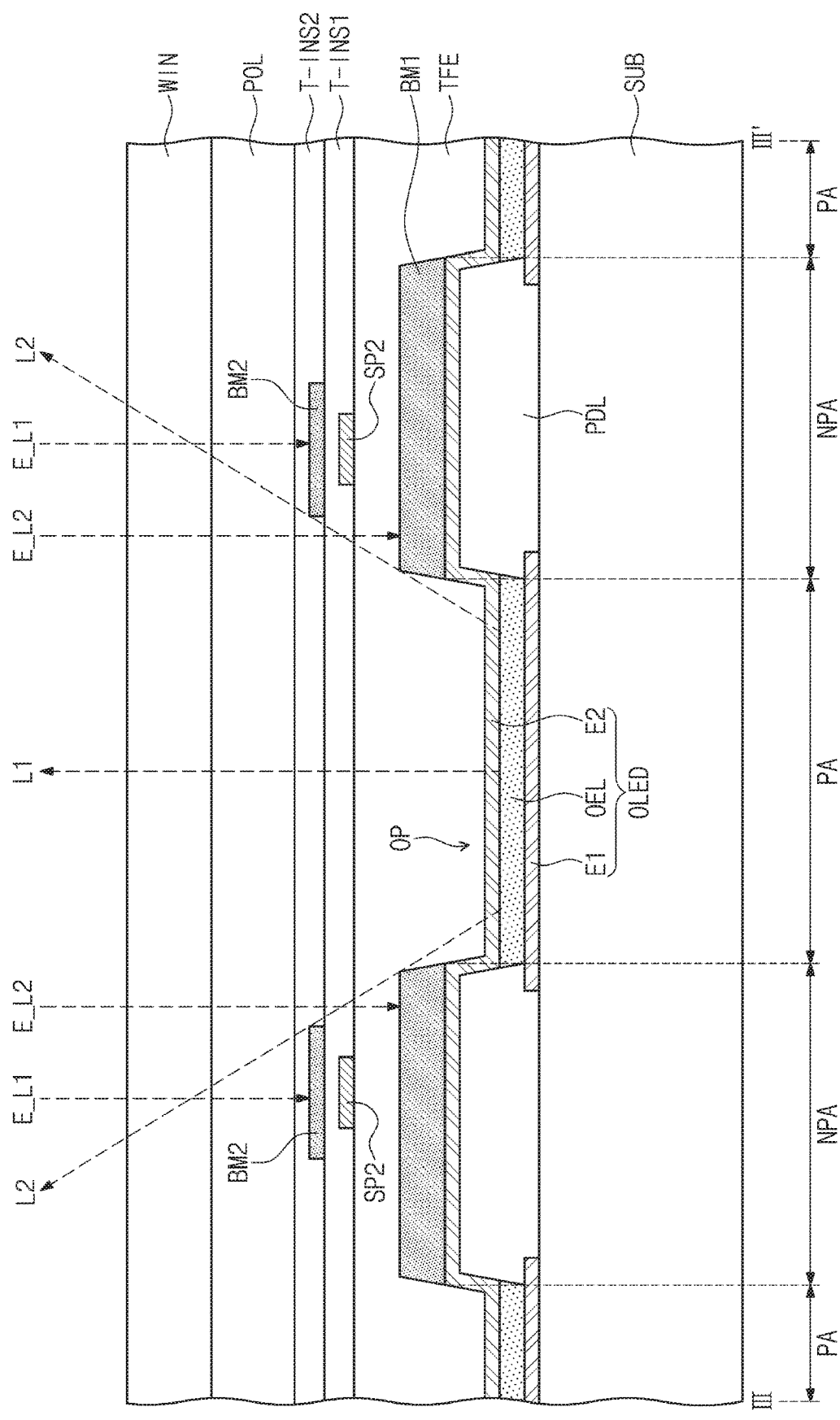
FIG. 10 is a cross-sectional view taken along a line III-III' of FIG. 9.

FIG. 10 is a cross-sectional view taken along a line III-III' of FIG. 9.

FIG. 10 illustrates cross-sectional structures of the display panel DP, the touch sensing unit TS, the polarizing film POL and the window WIN to explain a cross-sectional structure of the display device. The detailed components of the substrate SUB are omitted in FIG. 10 for the purpose of ease and convenience in description and illustration.

Referring to FIG. 10, the first black matrix BM1 may be disposed on the pixel defining layer PDL, and the second black matrix BM2 may be disposed on the first and second touch sensor portions SP1 and SP2. The polarizing film POL may be disposed on the second touch insulating layer T-INS2, and the window WIN may be disposed on the polarizing film POL.

The width of the first black matrix BM1 may be substantially equal to the width of the pixel defining layer PDL and may be greater than the width of the second black matrix BM2. In addition, as described above, the width of the second black matrix BM2 may be greater than those of the branch portions BP1 and BP2 of the mesh structure of each of the first and second touch sensor portions SP1 and SP2.

Lights L1 and L2 generated from the organic light emitting element OLED may be provided to a user through the polarizing film POL and the window WIN. The lights L1 and L2 may include first light L1 which vertically travels, and second light L2 which travels at a predetermined angle with the first light L1.

External lights E_L1 and E_L2 may pass through the window WIN and the polarizing film POL and then may be provided to the display panel DP. First external light E_L1, traveling toward the first and second touch sensor portions SP1 and SP2, of the external lights E_L1 and E_L2 may be absorbed in the second black matrix BM2. Second external light E_L2, traveling toward the pixel defining layer PDL, of the external lights E_L1 and E_L2 may be absorbed in the first black matrix BM1.

If the first and second black matrices BM1 and BM2 are not disposed in the display device 100, the first external light E_L1 may be reflected at the first and second touch sensor portions SP1 and SP2 and then may travel to the outside of the display device 100. In addition, the second external light E_L2 may be provided to the transistor TR through the pixel defining layer PDL and may be reflected at the gate electrode GE, the source electrode SE and the drain electrode DE of the transistor TR to travel to the outside of the display device 100. Thus, a light reflectance of the display device 100 may be increased.

In the case where the first and second black matrices BM1 and BM2 are not disposed in the display device 100, a sharpness of an image may be reduced by the first and second external lights E_L1 and E_L2 reflected in the display device 100. In particular, when a black image is displayed, the black image may not be clearly displayed due to the first and second external lights E_L1 and E_L2 reflected in the display device 100.

However, according to the embodiment of the present disclosure, the first and second black matrices BM1 and BM2 may absorb and block the first and second external lights E_L1 and E_L2, and thus it is possible to inhibit or prevent the first and second external lights E_L1 and E_L2 from being reflected. As a result, the light reflectance of the display device 100 may be reduced to improve the sharpness of an image.

If the width of the second black matrix BM2 is equal to the width of the first black matrix BM1, the second light L2 may be blocked by the second black matrix BM2, and thus the second light L2 may not be provided to a user. However, since the width of the second black matrix BM2 is smaller than the width of the first black matrix BM1 in the embodiment of the present disclosure, the second light L2 may be provided to a user. Thus, a viewing angle of the display device 100 may be increased.

As a result, the display device 100 according to the embodiment of the present disclosure may reduce the light reflectance to improve the sharpness of an image and may increase the viewing angle of the display device.

In the display device according to the embodiment of the present disclosure, the first black matrix may be disposed on the second electrode overlapping with the pixel defining layer, and the second black matrix may be disposed on the touch sensor portions. The first and second black matrices may absorb light provided to the second electrode and the touch sensor portions, and thus the light reflectance may be reduced and the sharpness of an image may be improved.

While the invention has been described with reference to example embodiments, it will be apparent to those skilled in the art that various changes and modifications may be made without departing from the spirits and scopes of the invention. Therefore, it should be understood that the above embodiments are not limiting, but illustrative. Thus, the scopes of the invention are to be determined by the broadest permissible interpretation of the following claims and their equivalents, and shall not be restricted or limited by the foregoing description.

What is claimed is:

1. A display device comprising:
    a substrate;
    a pixel defining layer disposed on the substrate and defining a plurality of openings;
    a plurality of organic light emitting elements disposed in the openings;
    a first black matrix disposed on the pixel defining layer;
    a thin film encapsulation layer disposed on the organic light emitting elements and the first black matrix;
    a plurality of touch sensor portions disposed on the thin film encapsulation layer, wherein the touch sensor portions have mesh structures and overlap with the pixel defining layer;
    a second black matrix disposed on the touch sensor portions; and
    a polarizing film disposed on the second black matrix,
    wherein the first black matrix overlaps the second black matrix and an entirety of the touch sensor portions, and
    wherein at least one of the touch sensor portions is disposed between the first black matrix and the second black matrix to not directly contact the second black matrix.

2. The display device of claim 1, wherein a width of the first black matrix is greater than a width of the second black matrix.

3. The display device of claim 1, wherein a width of the second black matrix is greater than those of branch portions of the mesh structure of each of the touch sensor portions.

4. The display device of claim 1, wherein a width of the first black matrix is substantially equal to a width of the pixel defining layer.

5. The display device of claim 1, further comprising:
    a first touch insulating layer disposed on the thin film encapsulation layer to cover the touch sensor portions; and
    a second touch insulating layer disposed on the first touch insulating layer,
    wherein the second black matrix is disposed on the first touch insulating layer,
    wherein the second touch insulating layer is disposed on the first touch insulating layer to cover the second black matrix, and
    wherein the polarizing film is disposed on the second touch insulating layer.

6. The display device of claim 5, wherein the touch sensor portions comprise:
    a plurality of first touch sensor portions arranged in a first direction and disposed on the thin film encapsulation layer;
    a plurality of first connection portions disposed on the first touch insulating layer, wherein each of the first connection portions connects adjacent ones of the first touch sensor portions;
    a plurality of second touch sensor portions arranged in a second direction intersecting the first direction and disposed on the thin film encapsulation layer; and
    a plurality of second connection portions disposed on the thin film encapsulation layer, wherein each of the second connection portions connects adjacent ones of the second touch sensor portions,
    wherein each of the first connection portions connects the first touch sensor portions adjacent to each other through contact holes formed in the first touch insulating layer.

7. The display device of claim 6, wherein the second black matrix is disposed on the first touch insulating layer to overlap with the first and second touch sensor portions and the first and second connection portions.

8. The display device of claim 7, wherein the second black matrix is disposed on the first touch insulating layer to cover the first connection portions.

9. The display device of claim 6, wherein each of the first and second touch sensor portions comprises:
a plurality of first branch portions extending in a first diagonal direction intersecting the first and second directions in a plane parallel to the first and second directions; and
a plurality of second branch portions extending in a second diagonal direction intersecting the first diagonal direction in the plane to intersect the first branch portions, wherein the second branch portions are connected to the first branch portions.

10. The display device of claim 9, wherein the pixel defining layer extends in the first diagonal direction and the second diagonal direction, and the first and second branch portions overlap with the pixel defining layer.

11. The display device of claim 1, wherein the substrate comprises: a plurality of transistors connected to the organic light emitting elements.

12. The display device of claim 11, wherein the organic light emitting elements comprise:
a plurality of first electrodes disposed on the substrate, exposed by the openings, and connected to the transistors;
a plurality of organic light emitting layers disposed on the first electrodes in the openings; and
a second electrode disposed on the organic light emitting layers and the pixel defining layer.

13. The display device of claim 12, wherein the first black matrix is disposed on a portion of the second electrode at locations where the second electrode overlaps with the pixel defining layer.

14. A display device comprising:
a substrate;
a pixel defining layer disposed on the substrate and defining a plurality of openings;
a plurality of organic light emitting elements disposed in the openings;
a first black matrix disposed on the pixel defining layer;
a thin film encapsulation layer disposed on the organic light emitting elements and the first black matrix;
a plurality of touch sensor portions disposed on the thin film encapsulation layer;
a plurality of connection portions disposed on the thin film encapsulation layer; and
a second black matrix disposed on the touch sensor portions,
wherein a width of the first black matrix is greater than a width of the second black matrix,
wherein the width of the second black matrix is greater than those of branch portions of the mesh structure of each of the touch sensor portions, and
wherein each of the connection portions connects adjacent ones of the touch sensor portions, the touch sensor portions and the connection portions have mesh structures and overlap with the pixel defining layer, and the second black matrix overlaps an entirety of the connection portions, and
wherein at least one of the touch sensor portions is disposed between the first black matrix and the second black matrix to not directly contact the second black matrix.

15. The display device of claim 14, wherein the width of the first black matrix is substantially equal to a width of the pixel defining layer.

16. The display device of claim 14, further comprising:
a first touch insulating layer disposed on the thin film encapsulation layer to cover the touch sensor portions; and
a second touch insulating layer disposed on the first touch insulating layer,
wherein the second black matrix is disposed on the first touch insulating layer, and
wherein the second touch insulating layer is disposed on the first touch insulating layer to cover the second black matrix.

17. The display device of claim 16, further comprising:
a polarizing film disposed on the second touch insulating layer; and
a window disposed on the polarizing film.

18. The display device of claim 16, wherein the touch sensor portions comprise:
a plurality of first touch sensor portions arranged in a first direction and disposed on the thin film encapsulation layer;
a plurality of first connection portions disposed on the first touch insulating layer, wherein each of the first connection portions connects adjacent ones of the first touch sensor portions;
a plurality of second touch sensor portions arranged in a second direction intersecting the first direction and disposed on the thin film encapsulation layer; and
a plurality of second connection portions disposed on the thin film encapsulation layer, wherein each of the second connection portions connects adjacent ones of the second touch sensor portions,
wherein each of the first connection portions connects the first touch sensor portions adjacent to each other through contact holes formed in the first touch insulating layer, and
wherein the second black matrix is disposed on the first touch insulating layer to overlap with the first and second touch sensor portions and the first and second connection portions.

19. The display device of claim 14, wherein the substrate comprises: a plurality of transistors connected to the organic light emitting elements,
wherein the organic light emitting elements comprise:
a plurality of first electrodes disposed on the substrate, exposed by the openings, and connected to the transistors;
a plurality of organic light emitting layers disposed on the first electrodes in the openings; and
a second electrode disposed on the organic light emitting layers and the pixel defining layer,
wherein the first black matrix is disposed on a portion of the second electrode at locations where the second electrode overlaps with the pixel defining layer.

20. A display device comprising:
a display panel comprising: a plurality of organic light emitting elements disposed in a plurality of pixel areas; and a first black matrix disposed in a non-pixel area around each of the pixel areas;
a touch sensing unit disposed on the display panel; and
a polarizing film disposed on the touch sensing unit,
wherein the touch sensing unit comprises:
a plurality of touch sensor portions having mesh structures;

a plurality of connection portions disposed on the thin film encapsulation layer; and a second black matrix disposed on the touch sensor portions, wherein a width of the second black matrix is greater than those of branch portions of the mesh structure of each of the touch sensor portions and is less than a width of the first black matrix, and wherein each of the connection portions connects adjacent ones of the touch sensor portions, the touch sensor portions and the connection portions have mesh structures and overlap with the pixel defining layer, and the second black matrix overlaps an entirety of the connection portions, and wherein at least one of the touch sensor portions is disposed between the first black matrix and the second black matrix to not directly contact the second black matrix.

* * * * *